(12) United States Patent
Li et al.

(10) Patent No.: US 12,057,534 B2
(45) Date of Patent: Aug. 6, 2024

(54) LIGHT EMITTING DIODE DISPLAY SCREEN FOR IMPROVING ILLUMINANCE UNIFORMITY THEREOF

(71) Applicant: APPOTRONICS CORPORATION LIMITED, Guangdong (CN)

(72) Inventors: Shijie Li, Shenzhen (CN); Fei Hu, Shenzhen (CN); Yi Li, Shenzhen (CN)

(73) Assignee: APPOTRONICS CORPORATION LIMITED, Guangdong (CN)

(*) Notice: Subject to any disclaimer, the term of this patent is extended or adjusted under 35 U.S.C. 154(b) by 624 days.

(21) Appl. No.: 17/281,158

(22) PCT Filed: Aug. 14, 2019

(86) PCT No.: PCT/CN2019/100486
§ 371 (c)(1),
(2) Date: Mar. 29, 2021

(87) PCT Pub. No.: WO2020/063157
PCT Pub. Date: Apr. 2, 2020

(65) Prior Publication Data
US 2021/0351331 A1 Nov. 11, 2021

(30) Foreign Application Priority Data
Sep. 28, 2018 (CN) .......................... 201811136823.1

(51) Int. Cl.
| | |
|---|---|
| *H01L 33/58* | (2010.01) |
| *G02B 5/02* | (2006.01) |
| *H01L 25/075* | (2006.01) |
| *H01L 33/00* | (2010.01) |

(52) U.S. Cl.
CPC ............ *H01L 33/58* (2013.01); *G02B 5/0215* (2013.01); *H01L 25/0753* (2013.01); *H01L 33/005* (2013.01)

(58) Field of Classification Search
CPC ...... H01L 33/58; H01L 33/005; G02B 5/0215
USPC .......................................................... 257/79
See application file for complete search history.

(56) References Cited

FOREIGN PATENT DOCUMENTS

| CN | 2845074 | 12/2006 |
|---|---|---|
| CN | 201270130 | 7/2009 |
| CN | 102411881 | 4/2012 |
| CN | 202434144 | 9/2012 |

(Continued)

OTHER PUBLICATIONS

English translation of CN108572481, Yuanming Liu (Year: 2018).*

(Continued)

*Primary Examiner* — Xia L Cross
(74) *Attorney, Agent, or Firm* — Burris Law, PLLC (57) ABSTRACT

Disclosed is an LED display screen, including an LED array including LED light emitting units and arranged on a substrate, a diffusion film arranged at a light-exiting side of the LED array, and a matrix light-shielding frame arranged between the LED array and the diffusion film. A hollow grid array including hollow grids is included. The hollow grids correspond one-to-one to the LED light emitting units and a projection of each hollow grid on the substrate surrounds a corresponding one of the plurality of LED light emitting units. Light emitted from the LED array can pass through a projection region of the matrix light-shielding frame on the diffusion film and exiting therefrom.

20 Claims, 4 Drawing Sheets

(56) References Cited

FOREIGN PATENT DOCUMENTS

| CN | 202887634 | | 4/2013 | | |
|---|---|---|---|---|---|
| CN | 104049374 | | 9/2014 | | |
| CN | 104575307 | | 4/2015 | | |
| CN | 105161012 | | 12/2015 | | |
| CN | 105933696 | | 9/2016 | | |
| CN | 108572481 | * | 9/2018 | ............. | H01L 33/58 |
| WO | 2013111696 | | 8/2013 | | |

OTHER PUBLICATIONS

First Office Action issued to corresponding Chinese Application No. 201811136823.1, issued Apr. 20, 2021, and an English Translation thereof, 13 pages.

International Search Report for International Application PCT/CN2019/100486, mailed Nov. 13, 2019.

* cited by examiner

LIGHT EMITTING DIODE DISPLAY SCREEN FOR IMPROVING ILLUMINANCE UNIFORMITY THEREOF

CROSS-REFERENCE TO RELATED APPLICATIONS

This application is a National Phase of International Application No. PCT/CN2019/100486, filed on Aug. 14, 2019, which claims priority to and the benefit of CN 201811136823.1, filed on Sep. 28, 2018. The disclosures of the above applications are incorporated herein by reference.

FIELD

The present disclosure relates to the field of display technologies, and relates to a light emitting diode (LED) display screen.

BACKGROUND

The statements in this section merely provide background information related to the present disclosure and may not constitute prior art.

An LED display screen is a display screen with a flat panel and consists of a plurality of small LED module panels, and each module panel includes a substrate provided with an LED array. Each LED array consists of a plurality of LED lamp beads, and pixels of an image are controlled through one or more LED lamp beads, so as to display information such as text, image, video and video signals. Due to the characteristics of high luminance of the LED lamp beads, a large screen composed of a dot matrix thereof can display very high luminance (easily higher than 1000 Nit), has high display uniformity, and has a better viewing effect than projection. In addition, each LED lamp bead responds quickly, can be controlled to be turned on or turned off individually, and can be completely turned off in case of black field so as to have a high contrast. Due to the above advantages as well as the continuous reduction in a cost of related elements and the continuous development of related technologies, LED large-screen display has gradually entered the field of high-quality video projection. With the continuous development of related technologies, application scenarios may continue to expand.

However, for a traditional LED large-sized the LED lamp bead corresponding to each pixel in the LED screen cannot fill the entire pixel size, and a large distance between the LED lamp beads results in a strong sense of granularity in image display, and the brightness distribution is extremely nonuniform, which makes the audience feel dazzled.

SUMMARY

This section provides a general summary of the disclosure and is not a comprehensive disclosure of its full scope or all of its features.

The present disclosure provides an LED display screen aiming to overcome the shortcomings of the prior art. Two structure arrangements are provided, that is, the matrix light-shielding frame is spaced apart from or contacts with the diffusion film, so that the light emitted from LED lamp beads can illuminate the diffusion film located above the matrix light-shielding frame, thereby increasing the illuminance of this region, increasing the illuminance uniformity of the LED display screen, and increasing the pixel filling rate.

The present disclosure provides the following technical solutions.

An LED display screen, including: an LED array including a plurality of LED light emitting units arranged on a substrate; a diffusion film arranged at a light-exiting side of the LED array; and a matrix light-shielding frame arranged between the LED array and the diffusion film and the matrix light-shielding frame includes a hollow grid array including a plurality of hollow grids, the plurality of hollow grids is one-to-one corresponding to the plurality of LED light emitting units, and a projection of each of the plurality of hollow grids on the substrate surrounds a corresponding LED light emitting unit. Light emitted from the LED array is capable of transmitting through a projection region of the matrix light-shielding frame on the diffusion film and exiting therefrom.

Specifically, in a form of the present disclosure, two structure arrangements of the matrix light-shielding frame and the diffusion film are provided.

A first structure arrangement is as follows: the matrix light-shielding frame is spaced apart from the diffusion film. This technical solution enables light emitted from the LED light emitting units to pass through a space between the matrix light-shielding frame and the diffusion film and to be obliquely incident to a projection region of the matrix light-shielding frame on the diffusion film, thereby eliminating frame-like dark streaks generated by non-uniform illuminance.

In a form of the present disclosure, a gap e is formed between the matrix light-shielding frame and the diffusion film, and the gap e is within a size range of 0 mm<e<2 mm.

In another form of the present disclosure, a portion of the substrate at a periphery of the LED array is provided with a support frame, opposite side ends of the diffusion film respectively pass through the support frame and extend to a back side of the LED array, and a height of the support frame is larger than a height of the matrix light-shielding frame. This technical solution is conducive to straightening and flattening the diffusion film and improving the uniformity of the emitted light.

A second structure arrangement is as follows: the matrix light-shielding frame contacts with the diffusion film, and at least a part of a portion that the matrix light-shielding frame contacting with the diffusion film is a non-opaque structure. This technical solution can guide light from the LED light emitting unit to the projection region of the matrix light-shielding frame on the diffusion film through the non-opaque structure contacting with the diffusion film, thereby eliminating the frame-like dark streaks generated by non-uniform illuminance.

In the second structure arrangement, in a form of the present disclosure, the matrix light-shielding frame includes a transparent framework and an opaque coating layer, and a side surface of the transparent framework is provided with a non-opaque region and an opaque region. The opaque coating layer is arranged on the opaque region. A top of the transparent framework directly contacts with the diffusion film, and the light enters the transparent framework through the non-opaque region and then is guided to a contacting surface between the transparent framework and the diffusion film. In this technical solution, on the one hand, the transparent framework mainly having a mechanical load-bearing function is separated from the opaque coating layer mainly having a light shielding function, thereby being conducive to configuration of different functional regions and being capable of reducing manufacturing costs and process difficulty; and on the other hand, the light from the LED light emitting unit can be transmitted through the transparent framework, thereby being conducive to guiding the light to the projection region of the matrix light-shielding frame on the diffusion film.

In a form, the non-opaque region is close to the diffusion film. In this technical solution, after the light emitted from the LED light emitting unit transmits in the hollow grid, the light is obliquely incident to the non-opaque region and then directly reaches the contacting surface between the transparent framework and the diffusion film.

In a form, the non-opaque region is arranged at a middle or bottom position of the matrix light-shielding frame, and the opaque coating layer is a reflective layer. In this technical solution, large-angle light emitted from the LED light emitting unit is incident to the transparent framework of the matrix light-shielding frame through the non-opaque region, is reflected inside the transparent framework by the opaque coating, and is finally guided to the contacting surface between the transparent framework and the diffusion film. In addition to serving as a carrier for carrying the opaque coating layer, the transparent framework provides a function of inhibiting (e.g., preventing) interference, and also provide a function of guiding light, thereby eliminating a dark region of the projection of the light-shielding frame on the diffusion film.

In another form of the present disclosure, the matrix light-shielding frame includes a first part and a second part stacked in sequence along a direction in which light exits. The second part is a non-opaque structure, and the second part contacts with the diffusion film, allowing the light to illuminate the corresponding diffusion film region through the second part of the matrix light-shielding frame.

In another form of the present disclosure, a top of the matrix light-shielding frame has a shape of arc. With such a structure, a cross-sectional area of the light-shielding frame at a light-exiting side can be reduced, and a projection area of the light-shielding frame on the diffusion film can be reduced. In this structure, the matrix light-shielding frame may be spaced apart from the diffusion film, thereby bringing an effect similar to the effect in the first structure arrangement described above; or the matrix light-shielding frame may contact with the diffusion film and may be tangent to a lower surface of the diffusion film, thereby greatly reducing an area where the matrix light-shielding frame shields the diffusion film.

In order to account for the illuminance of this region corresponding to the matrix light-shielding frame on the diffusion film decreases suddenly, a thickness of a wall of the matrix light-shielding frame gradually increases along a direction towards the LED array.

In a form, a thickness g of each side wall of the matrix light-shielding frame at a light-exiting side is within a size range of $0.05\ mm<g<0.5\ mm$.

In a form of the present disclosure, a height of the matrix light-shielding frame is within a size range from 0.5 mm to 10 mm, for example within a size range from 2 mm to 4 mm.

In the present disclosure, the matrix light-shielding frame may be formed by various methods, such as 3D printing, injection molding, or crisscross splicing of light-shielding strips.

In a form, the LED display screen further includes a polarizer that is arranged on a light path through which the light emitted from the LED array passes, and the polarizer includes an array of first and second polarization regions arranged alternately. The light emitted from the LED array passes through the first polarization region to form first polarized light and passes through the second polarization region to form second polarized light.

In summary, the present disclosure provides an LED display screen. Two structure arrangements are provided, that is, the matrix light-shielding frame is spaced apart from or contacts with the diffusion film, so that the light emitted from LED lamp beads can illuminate the diffusion film located above the matrix light-shielding frame, thereby increasing the illuminance of this region and improving the illuminance uniformity of the LED display screen.

The technical solution of the present disclosure will be described in detail in the following with reference to the accompanying drawings and specific forms.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 9b is a schematic structural diagram of a pixel of an LED display screen according to a modified form of FIG. 9a.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
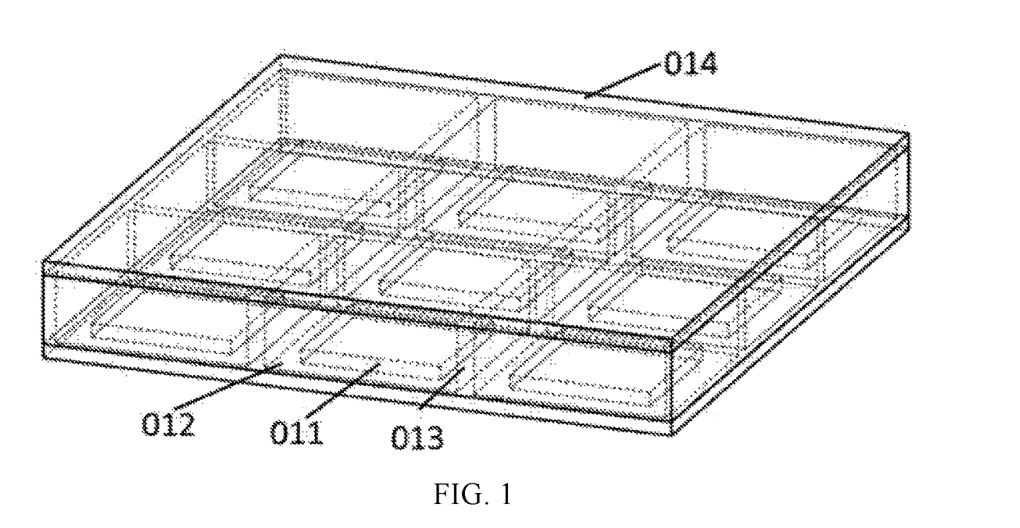
FIG. 1 is a schematic diagram of a partial structure of an existing LED screen.

The technical scheme of application publication number CN104049374A provides an LED screen capable of implementing surface light-emission. As shown in FIG. 1, a barrier frame 013 having an inner wall provided with a reflective layer is provided between pixels of an LED pixel array 011 to ensure that adjacent LED pixels do not interfere; moreover, a light homogenizing plate 014 is provided on the barrier frame 013 to improve light uniformity.

However, in this technical solution, the barrier frame 013 directly abuts the light homogenizing plate 014, as a result, the LED light cannot reach a position where the light homogenizing plate 014 contacts with the barrier frame 013, making the entire LED screen display a black frame-like region similar to a shape of the barrier frame 013. Thus, an optimal pixel filling rate cannot be achieved.

In general, the present disclosure provides an LED display screen, including: an LED array including a plurality of LED light emitting units and arranged on a substrate; a diffusion film arranged at a light-exiting side of the LED array; and a matrix light-shielding frame arranged between the LED array and the diffusion film and the matrix light-shielding frame includes a hollow grid array including a plurality of hollow grids. The plurality of hollow grids are one-to-one corresponding to the plurality of LED light emitting units, and a projection of each of the plurality of hollow grids on the substrate surrounds a corresponding one of the plurality of LED light emitting units. Light emitted from the LED array is capable of transmitting through a projection region of the matrix light-shielding frame on the diffusion film and exiting therefrom. Specifically, in a form of the present disclosure, two structure arrangements of the matrix light-shielding frame and the diffusion film are provided: a first structure arrangement is that the matrix light-shielding frame is spaced apart from the diffusion film; and a second structure arrangement is that the matrix light-shielding frame contacts with the diffusion film, and at least a part of a portion of the matrix light-shielding frame contacting with the diffusion film is a non-opaque structure. Hereinafter, various specific structure arrangements of the present disclosure will be described in detail with reference to specific forms.

Figure 2:
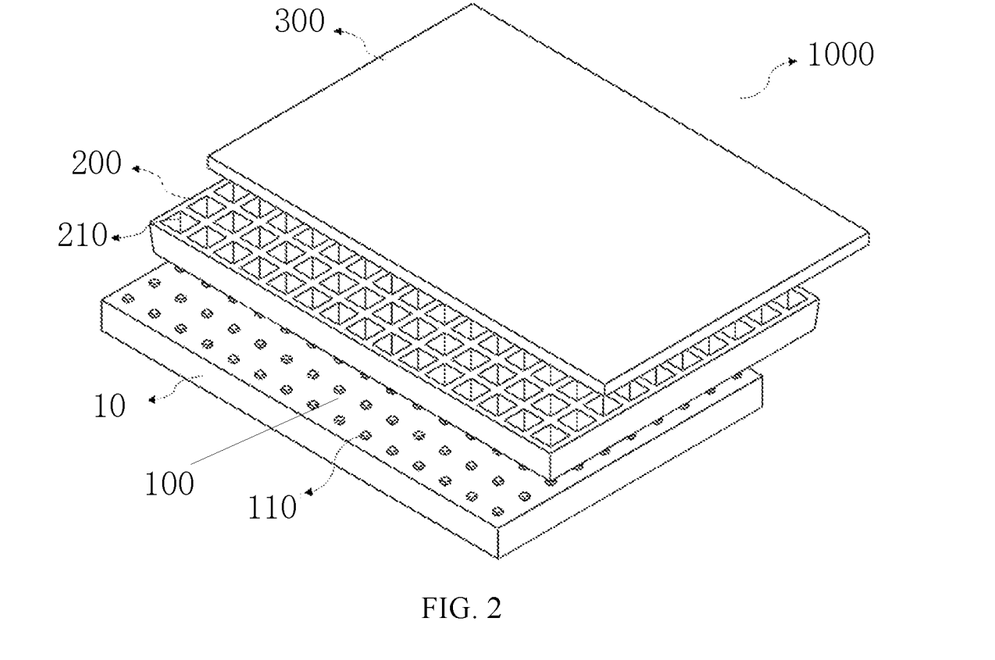
FIG. 2 is a schematic diagram of an overall structure of an LED display screen according to the present disclosure.

FIG. 2 is a schematic diagram of an overall structure of an LED display screen according to the present disclosure. As shown in FIG. 2, the present disclosure provides an LED display screen 1000 including a substrate 10, an LED array 100, a matrix light-shielding frame 200, and a diffusion film 300 arranged in sequence. The diffusion film 300 is arranged at a light-exiting side of the LED array 100. The LED array 100 is an array composed of a plurality of LED light emitting units 110 (i.e., LED lamp beads), which are arranged on the substrate 10, and each light-emitting point serves as an individual pixel of the display screen, and one LED light emitting unit 110 corresponds to one pixel of the LED display screen. Pixels include red, green, and blue pixels, that is, it is an RGB light-emitting chip. The matrix light-shielding frame 200 is arranged between the LED array 100 and the diffusion film 300 and includes a hollow grid array including a plurality of hollow grids 210. A pitch of the hollow grids 210 is consistent with the dot pitch of the LED light emitting units, and the hollow grids are in one-to-one correspondence with the LED light emitting units 110. The hollow grids have a uniform pitch and side walls with a certain thickness. Each LED light emitting unit is placed directly below a respective one grid of the matrix light-shielding frame, and a center of each LED light emitting unit is aligned with or slightly deviated from a center of the respective one grid of the matrix light-shielding frame, provided that a projection of the respective one hollow grid onto the substrate 10 surrounds the corresponding LED light emitting unit. Each grid of the matrix light-shielding frame includes four side walls, which may be either an absorbing layer or a reflective layer. In other words, light cannot pass through any of the four side walls. In such a configuration, light of the LEDs can be homogenized by the side walls which are highly reflective, so that light interference between pixels can be avoided while the brightness of each pixel can be uniformly distributed.

In the present disclosure, the light emitted from the LED array 100 can be emitted through a projection region of the matrix light-shielding frame on the diffusion film 300. The diffusion film 300 covers the matrix light-shielding frame 200 to further increase a visual angle of the screen and serve as a cover at the same time, so that the LED display screen has a smooth display appearance, and has a continuous and uniform display appearance under various ambient light conditions no matter when viewed at a distance or closely. The light emitted from the LED array illuminates the diffusion film, which makes the diffusion film a new "passive light-emitting source", so that the pixel filling rate is increased. At the same time, the diffusion film has a diverging effect on the light, thereby increasing the visual angle of the LED display screen. The side walls of the grids of the matrix light-shielding frame have functions of guiding light and restricting light interference between pixels. The matrix light-shielding frame needs to be higher than a certain height, which makes illuminance distribution in the pixels uniform. The high pixel filling rate and uniform illuminance distribution help to improve the accuracy of point-by-point correction of the LED display screen.

In the present disclosure, the pitch p of the matrix light-shielding frame 200 is within a size range from 0.1 mm to 10 mm, for example within a size range from 1 mm to 2.5 mm. The pitch p refers to a distance between two opposite side walls of a hollow grid of the matrix light-shielding frame, and may also be equal to a distance between centers of two adjacent LED light emitting units. A thickness of the side wall of the matrix light-shielding frame is within a size range from 0.05 mm to 2 mm, for example within a size range from 0.2 mm to 0.8 mm. A height of the matrix light-shielding frame 200 is within a size range from 0.5 mm to 10 mm, for example within a size range from 2 mm to 5 mm.

When the side wall of the grid of the matrix light-shielding frame includes a reflective layer, the reflective layer may be a specular reflective layer, such as aluminum silver powder, or a scattering particle coating layer with high reflectivity. If the matrix light-shielding frame 200 includes a material with high reflectivity, such as a metal material, then there is no need to additionally provide a reflective layer.

In a form of the present disclosure, the LED display screen further includes a polarizer, which is arranged on a light path through which the light emitted from the LED array passes. The polarizer includes an array of first and second polarization regions arranged alternately, and the light emitted from the LED array passes through the first polarization region to form first polarized light and passes through the second polarization region to form second polarized light. By adding the polarizer, the light emitted from the LED array can form an image with two polarization states, thereby achieving 3D display.

The polarizer may be arranged between the matrix light-shielding frame and the optical diffusion film. The polarizer may also be arranged on one side of the optical diffusion film away from the LED array. In order to protect the polarizer from abrasion, the polarizer may be further arranged on a surface of the transparent substrate close to the LED array.

The first polarization region and the second polarization region may be alternately arranged in a shape of strip. The first polarization region and the second polarization region may also be alternately arranged in horizontal and vertical directions, respectively, which are similar to black and white squares of chess.

FIG. 2 shows an overall structure of an LED display screen according to the present disclosure. Specific structure arrangements of the matrix light-shielding frame of the present disclosure being spaced apart from the diffusion film or contacting with the diffusion film are respectively described in multiple forms as follows. For convenience, the accompanying drawings corresponding to the forms are described by mainly using a schematic structural diagram of a single pixel of an LED display screen.

Form 1

Figure 3:
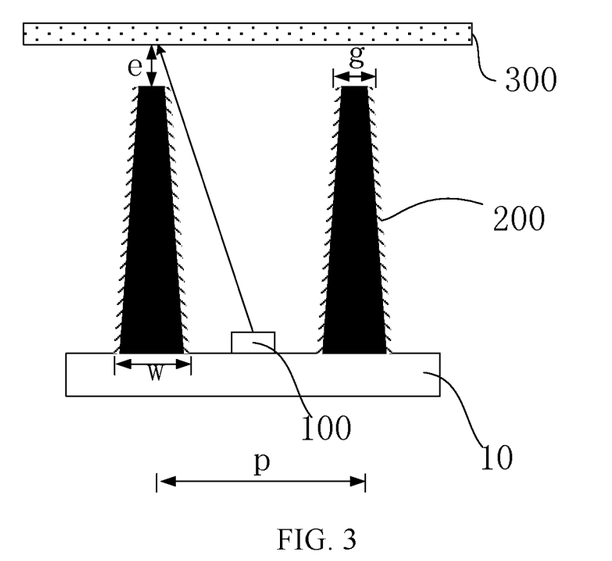
FIG. 3 is a schematic structural diagram of a pixel of an LED display screen according to Form 1 of the present disclosure.

FIG. 3 is a schematic structural diagram of a pixel of an LED display screen according to Form 1 of the present disclosure. As shown in FIG. 3, the matrix light-shielding frame 200 is spaced apart from the diffusion film 300, and the LED light emitting unit 110 is arranged on the substrate 10. Furthermore, in this form, a gap e is formed between the matrix light-shielding frame 200 and the diffusion film 300, and the gap e is within a size range of 0 mm<e<2 mm, so that light emitted from the LED light emitting units 110 (lamp beads) in the LED array can pass through the gap e to illuminate the diffusion film 300 located above the matrix light-shielding frame 200, thereby increasing the illuminance of this region and improving the final display effect.

In this form, the unit size of the matrix light-shielding frame 200 is p, which is the same as the dot pitch of the LED display screen; the thickness of the side wall of the matrix light-shielding frame 200 is smaller than p, and the thickness of a wall of the matrix light-shielding frame 200 gradually increases along a direction towards the LED array (as shown in the figure, a shape of longitudinal cross-section of the matrix light-shielding frame may be an isosceles trapezoid). A thickness w of the side wall at a light-entering side of the matrix light-shielding frame 200 is larger than a thickness g of the side wall at a light-exiting side of the matrix light-shielding frame 200. In this form, the thickness g of the side wall at the light-exiting side is within a size range of 0.05 mm<g<0.5 mm, for example 0.2 mm. In addition, the height of the matrix light-shielding frame 200 is within a size range from 0.5 mm to 10 mm, for example within a size range from 2 mm to 4 mm.

It can be understood that the shape of the matrix light-shielding frame of the present disclosure may also be a structure in which the side walls have a same thickness, and a dimension of the matrix light-shielding frame in other form of the present disclosure may also refer to the dimension in Form 1.

All other regions on the substrate 10 within the pixel except the LED light emitting unit are light-absorbing layers, with an absorption rate above 50%, for example 95%, so as to improve the anti-ambient light effect of the LED display screen. The side wall of the matrix light-shielding frame is an absorptive layer, a reflective layer or a scattering layer.

Form 2

Figure 4:
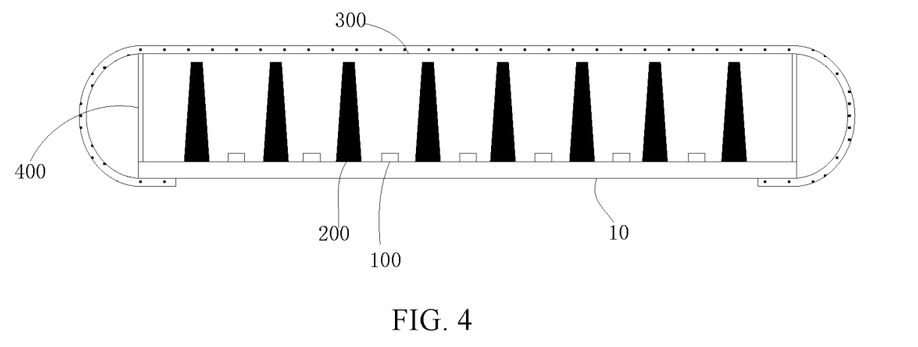
FIG. 4 is a schematic structural diagram of an LED display screen according to Form 2 of the present disclosure.

FIG. 4 is a schematic structural diagram of an LED display screen according to Form 2 of the present disclosure. As shown in FIG. 4, in this form, a support frame 400 having a height higher than the height of the matrix light-shielding frame 200 is formed at a periphery of the LED display screen, and the diffusion film 300 extends to the back of the display screen through the support frame 400 and is fixed to a back panel of the LED display screen. By adjusting the height of the support frame, a distance between the diffusion film 300 and the matrix light-shielding frame 200 can be adjusted. That is, a portion of the substrate 10 on the periphery of the LED array 100 is provided with a support frame 400, opposite side ends of the diffusion film 300 respectively pass through the support frame 400 and extend to the back of the LED array 100, and the height of the support frame 400 is larger than the height of the matrix light-shielding frame 200, so as to provide interval arrangement of the diffusion film 300 and the matrix light-shielding frame 200. This structure can make light emitted from the LED lamp beads in the LED array 100 pass through the gap between the diffusion film 300 and the matrix light-shielding frame 200 to illuminate the diffusion film 300 located above the matrix light-shielding frame 200 through, thereby increasing the illuminance of this region and improving the final display effect.

This technical solution achieves control of a gap between the diffusion film and the matrix light-shielding frame in a simple manner, and also avoids unevenness of the diffusion film, which would be caused by possible height fluctuations of the matrix light-shielding frame.

Form 3

Figure 5:
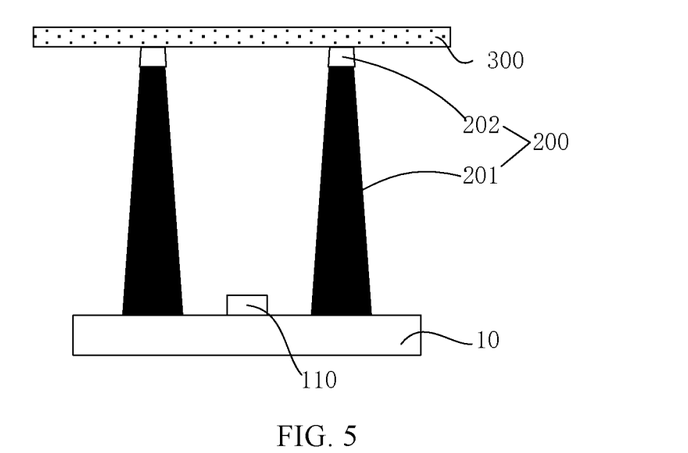
FIG. 5 is a schematic structural diagram of a pixel of an LED display screen according to Form 3 of the present disclosure.

FIG. 5 is a schematic structural diagram of a matrix light-shielding frame according to Form 3 of the present disclosure. As shown in FIG. 5, the matrix light-shielding frame 200 contacts with the diffusion film 300. In this form, the matrix light-shielding frame 200 includes a first part 201 and a second part 202 stacked in sequence along a direction in which light exits, and the second part 202 is a non-opaque structure. The matrix light-shielding frame 200 contacts with the diffusion film 300 through the second part 202, to allow light to pass through the second part 202 of the matrix light-shielding frame 200 to illuminate a projection region of the matrix light-shielding frame 200 on the diffusion film 300, thereby increasing the illuminance of this region.

In this form, the diffusion film 300 is not arranged suspended, but is arranged on the non-opaque second part 202 of the matrix light-shielding frame 200, which is conducive to position stability of the diffusion film of the large-sized LED display screen.

In this form, the first part 201 and the second part 202 of the matrix light-shielding frame 200 can be formed by injection molding respectively, and then the two are stacked and connected to form a complete structure; or an integrated structure is obtained by two-step injection molding. Specifically, when forming the second part 202, a transparent material such as PC or PMMA may be adopted.

Form 4

Figure 6:
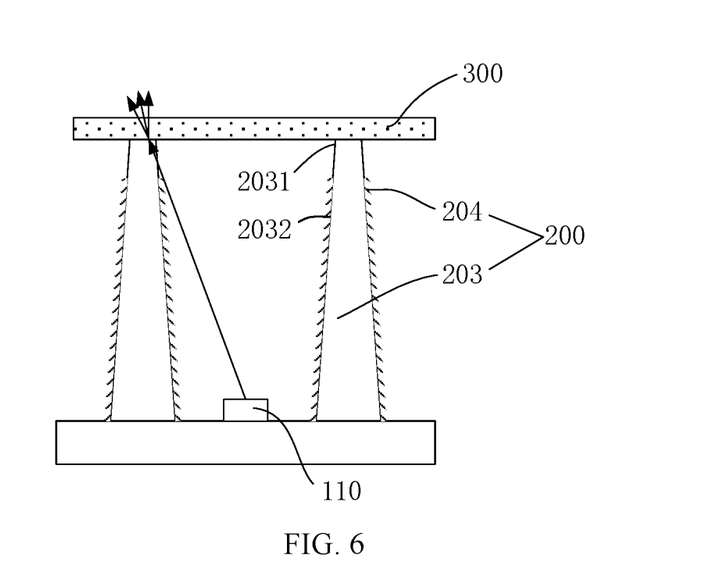
FIG. 6 is a schematic structural diagram of a pixel of an LED display screen according to Form 4 of the present disclosure.

FIG. 6 is a schematic structural diagram of a matrix light-shielding frame according to Form 4 of the present disclosure. As shown in FIG. 6, in this form, the matrix light-shielding frame 200 includes a transparent framework 203 and an opaque coating layer 204, and a side surface of the transparent framework includes a non-opaque region 2031 and an opaque region 2032. The opaque region 2032 is formed by applying the opaque coating layer 204.

The transparent framework 203 is made of a transparent material, such as PC or PMMA. A top of the transparent framework 203 directly contacts with the diffusion film 300, so that there is no light-shielding structure between the two, and light incident into the transparent frame 203 can be guided to a contacting surface between the transparent frame 203 and the diffusion film 300 and then enters the diffusion film 300.

In this form, the non-opaque region 2031 is arranged at a position close to the diffusion film 300, that is, the non-opaque region 2031 is arranged at a top position of the transparent framework 203. The light emitted from the LED light emitting unit 110 is incident into the non-opaque region 2031 on the side surface of the transparent framework 203 directly or after being reflected, enters the transparent framework 203, is then guided to the contacting surface between the transparent framework 203 and the diffusion film, enters the diffusion film 300, and is then emitted, forming part of the emitted light of the LED display screen.

In the form shown in FIG. 6, the non-opaque region 2031 is arranged at a position close to the diffusion film 300. In other forms, the non-opaque region may also be arranged at a position away from the diffusion film, as long as the transparent framework directly contacts with the diffusion film and the light can be guided to the projection region of the matrix light-shielding frame on the diffusion film by the light guiding effect of the transparent framework.

Form 5

Figure 7:
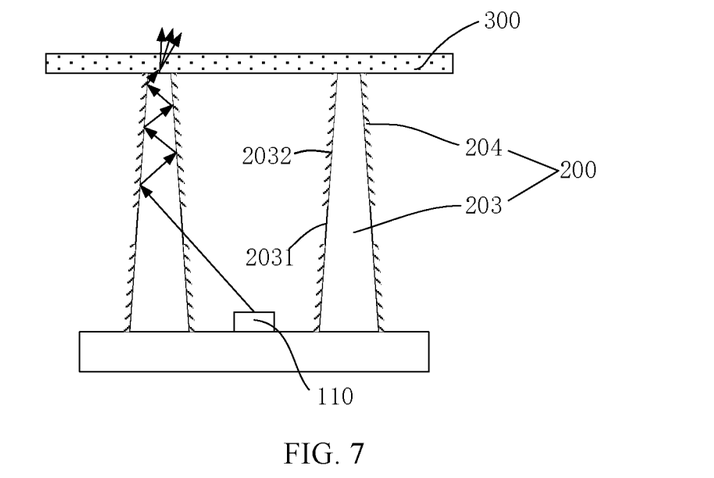
FIG. 7 is a schematic structural diagram of a pixel of an LED display screen according to Form 5 of the present disclosure.

FIG. 7 is a schematic structural diagram of a matrix light-shielding frame according to Form 5 of the present disclosure. As shown in FIG. 7, in this form, the matrix light-shielding frame 200 includes a transparent framework 203 and an opaque coating layer 204. The opaque coating layer 204 is arranged on an opaque region 2032 on a side surface of the transparent framework 203. Different from the form shown in FIG. 6 described above, in this form, the non-opaque region 2031 is arranged at a middle position of the matrix light-shielding frame.

In this form, the opaque coating layer 204 is a reflective layer, and large-angle light emitted from the LED light emitting unit 110 (that is, light that cannot be directly emitted from a light outlet of the matrix light-shielding frame 200) is incident into the transparent framework 203 of the matrix light-shielding frame 200 through the non-opaque region 2031, and is then reflected multiple times in the transparent framework 203 under an action of the reflective layer 204, and is finally guided to a contacting surface between the transparent framework 203 and the diffusion film 300, and then is emitted from the diffusion film 300, forming part of the emitted light of the LED display screen, which fills a black frame region formed by an original projection of the matrix light-shielding frame onto the diffusion film.

Form 6

Figure 8:
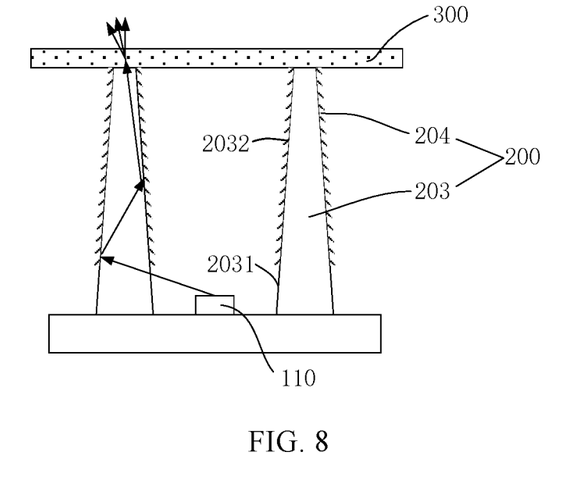
FIG. 8 is a schematic structural diagram of a pixel of an LED display screen according to Form 6 of the present disclosure.

FIG. 8 is a schematic structural diagram of a matrix light-shielding frame according to Form 6 of the present disclosure. As shown in FIG. 8, in this form, the matrix light-shielding frame 200 includes a transparent framework 203 and an opaque coating layer 204. The opaque coating layer 204 is arranged on an opaque region 2032 on a side surface of the transparent framework 203. Different from the form shown in FIG. 7 described above, in this form, the non-opaque region 2031 is arranged at a bottom position of the matrix light-shielding frame 200 (i.e., a position close to the LED array). The above-described structure can make the LED lamp beads in the LED array 100 emit ultra-large-angle light into the transparent framework 203 through the non-opaque region 2031, and after multiple reflections, the light illuminates the diffusion film 300 located on the matrix light-shielding frame 200, thereby increasing the illuminance of this region and improving the final display effect.

The above forms are structure arrangements according to the present disclosure in which the matrix light-shielding frame contacts with the diffusion film. It can be seen that from FIG. 3 to FIG. 8, the top of the matrix light-shielding frame is a planar structure, but the present disclosure does not limit the top of the matrix light-shielding frame to the planar structure. By setting the top of the matrix light-shielding frame to be a shape of arc, an area of the light-exiting side of the matrix light-shielding frame can be reduced and the influence of the projection of the matrix light-shielding frame onto the diffusion film can be reduced. Please refer to the following forms.

Form 7

Figure 9A:
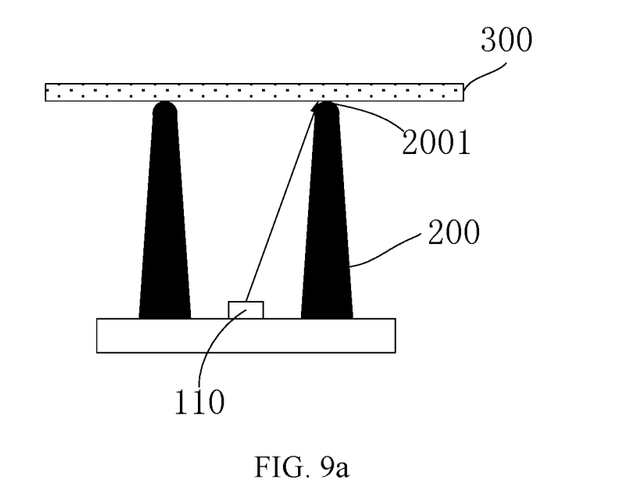
FIG. 9a is a schematic structural diagram of a pixel of an LED display screen according to Form 7 of the present disclosure.

FIG. 9a is a schematic structural diagram of a pixel of an LED display screen according to Form 7 of the present disclosure. As shown in FIG. 9a, in this form, the top 2001 of the matrix light-shielding frame 200 has a shape of arc, and is tangent to a lower surface (i.e., a surface close to the LED array) of the diffusion film 300 to form a contacting part. The structure having a shape of arc is not only conducive to an injection molding and pattern drawing process, but also more conducive to illumination of the light emitted from the LED light emitting unit 110 to the diffusion film 300 located above the matrix light-shielding frame, thereby increasing the illuminance of the corresponding region.

Figure 9B:
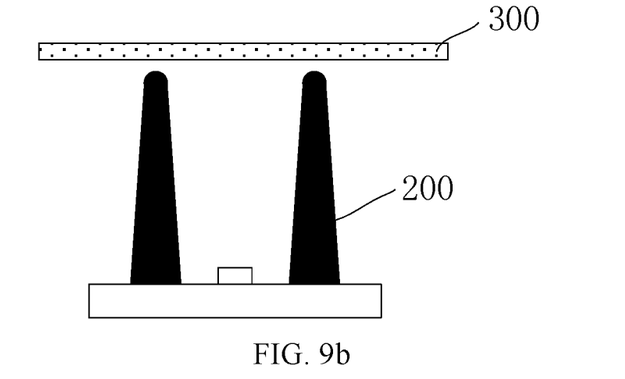

It can be understood that the matrix light-shielding frame with a top having a shape of arc can be applied to the technical solutions shown in FIGS. 3 and 4. Referring to FIG. 9b, which is a schematic structural diagram of a pixel of an LED display screen according to Form 7 of the present disclosure, the diffusion film 300 is spaced apart from the matrix light-shielding frame 200 with a gap. In this form, the light illuminates the diffusion film located above the matrix light-shielding frame mainly through the gap, and the top with a shape of arc of the matrix light-shielding frame 200 is conductive to an injection molding and pattern drawing process.

It can be understood that the top with a shape of arc of the matrix light-shielding frame shown in FIG. 9a and FIG. 9b can be applied to the above forms.

The matrix light-shielding frame can be manufactured by various methods, such as 3D printing, injection molding, or crisscross splicing of light-shielding strips.

In a form of the present disclosure, a method for rapidly manufacturing a matrix light-shielding frame by using a 3D printing technology is provided. In this method, firstly, a matrix light-shielding frame needs to be 3D printed, for example by SLA light curing. Secondly, an opaque coating layer needs to be applied to an inner side wall of the matrix light-shielding frame. Generally, this method uses a resin material as a frame for 3D printing, which does not have high reflectivity or light absorption property, so an opaque coating layer needs to be applied to an inner wall. There are many methods for applying an opaque coating layer to a resin layer, for example an electroless plating method based on dopamine-reduced silver (corresponding to a silver reflective layer), a reflective paint immersion method, a spray method, and the like.

In another form of the present disclosure, a method for manufacturing a matrix light-shielding frame on a large scale is provided. In this method, firstly, a metal mold is manufactured, that is, a metal mold with the same structure as the matrix light-shielding frame is manufactured by metal processing. Then, a silica gel mold is used to manufacture the mold by rollover. Specifically, the structure of the metal mold is reprinted with the silica gel mold to form an inverse structure of the matrix light-shielding frame. Then, the matrix light-shielding frame is manufactured by injection molding with the silica gel mold. The manufacturing of a coating layer of a plastic matrix light-shielding frame is similar to that of 3D printing, and will not be repeated herein.

In another form of the present disclosure, a method for manufacturing a matrix light-shielding frame by crisscross splicing of light-shielding strips is provided. In this method, the light-shielding strips are metal strips. Of course, the material thereof can also be selected according to an actual requirement. Specifically, the metal strips with a width equal to the thickness of the matrix light-shielding frame and a thickness equal to the thickness of the side wall of the matrix light-shielding frame are cut with laser light to form slots, each of which has the same thickness as the metal strip and a length that is half the width of the metal strip. For an (M×N) LED light source array, the number of metal strips desired (e.g., required) will be (M+1)×(N+1). In some variations, the material of the metal strip is an aluminum alloy due to its high reflectivity, so that there is no need to apply a high-reflective material to an inner side wall of the matrix light-shielding frame in this form.

In the above-described technical solution of obtaining a matrix light-shielding frame by crisscross splicing of light-shielding strips, a transparent material may also be adopted as a light-shielding strip for splicing, in which case an opaque coating layer is provided on the surface of the light-shielding strip to achieve a light-shielding function. This manufacturing method is applied to the technical solution as shown in FIGS. 6-8 in which the matrix light-shielding frame includes a transparent framework and an opaque coating layer, so that the transparent framework of the matrix light-shielding frame is divided into short edges (edges corresponding to pixels), which can inhibit (e.g., prevent) the light from crossing over neighboring pixels as it travels in the transparent framework.

In summary, the present disclosure provides an LED display screen. By making the diffusion film be spaced apart from the matrix light-shielding frame or making at least a part of a portion of the matrix light-shielding frame contacting with the diffusion film be a non-opaque structure, the light emitted from LED lamp beads can illuminate the diffusion film located above the matrix light-shielding frame, thereby increasing the illuminance of this region and improving the illuminance uniformity of the LED display screen, and thus improving the final display effect. The LED display screen can be applied to scenarios such as theaters, living rooms, office places, and billboards.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An LED A light emitting diode (LED) display screen, comprising:
    an LED array comprising a plurality of LED light emitting units and arranged on a substrate;
    a diffusion film arranged at a light-exiting side of the LED array; and
    a matrix light-shielding frame arranged between the LED array and the diffusion film, and split from the substrate, wherein the matrix light-shielding frame comprises a hollow grid array comprising a plurality of hollow grids, the plurality of hollow grids is one-to-one corresponding to the plurality of LED light emitting units, a pitch of the hollow grids is consistent with a dot pitch of the plurality of LED light emitting units, the hollow grids are in one-to-one correspondence with the LED light emitting units, and a projection of each of the plurality of hollow grids on the substrate surrounds a corresponding one of the plurality of LED light emitting units;
    wherein light emitted from the LED array is capable of transmitting through a projection region of the matrix light-shielding frame on the diffusion film and exiting therefrom.

2. The LED display screen according to claim 1, wherein the matrix light-shielding frame is spaced apart from the diffusion film.

3. The LED display screen according to claim 2, wherein a gap e is formed between the matrix light-shielding frame and the diffusion film, and the gap e is within a size range of 0 mm<e<2 mm.

4. The LED display screen according to claim 2, wherein a portion of the substrate at a periphery of the LED array is provided with a support frame, opposite side ends of the diffusion film respectively pass through the support frame and extend to a back side of the LED array through the support frame, and a height of the support frame is larger than a height of the matrix light-shielding frame.

5. The LED display screen according to claim 1, wherein a top of the matrix light-shielding frame has a shape of arc.

6. The LED display screen according to claim 1, wherein a thickness of a wall of the matrix light-shielding frame gradually increases along a direction towards the LED array.

7. The LED display screen according to claim 6, wherein the thickness g of the side wall of the matrix light-shielding frame at a light-exiting side is within a size range of 0.05 mm<g<0.5 mm.

8. The LED display screen according to claim 1, wherein a height of the matrix light-shielding frame is within a size range from 0.5 mm to 10 mm.

9. The LED display screen according to claim 1, wherein the matrix light-shielding frame is formed by 3D printing, injection molding or crisscross splicing of light-shielding strips.

10. The LED display screen according to claim 1, further comprising a polarizer arranged on a light path through which the light emitted from the LED array passes, wherein the polarizer comprises an array of first and second polarization regions arranged alternately, and light emitted from the LED array passes through the first polarization region to form first polarized light and passes through the second polarization region to form second polarized light.

11. The LED display screen according to claim 1, wherein the height of the matrix light-shielding frame is within a size range from 2 mm to 4 mm.

12. A light emitting diode (LED) display screen, comprising:
   an LED array comprising a plurality of LED light emitting units and arranged on a substrate;
   a diffusion film arranged at a light-exiting side of the LED array; and
   a matrix light-shielding frame arranged between the LED array and the diffusion film and comprising a hollow grid array comprising a plurality of hollow grids, wherein the plurality of hollow grids is one-to-one corresponding to the plurality of LED light emitting units, and a projection of each of the plurality of hollow grids on the substrate surrounds a corresponding one of the plurality of LED light emitting units;
   wherein light emitted from the LED array is capable of transmitting through a projection region of the matrix light-shielding frame on the diffusion film and exiting therefrom; and
   wherein the matrix light-shielding frame contacts the diffusion film, and at least a part of a portion of the matrix light-shielding frame contacting the diffusion film is a non-opaque structure.

13. The LED display screen according to claim 12, wherein the matrix light-shielding frame comprises a transparent framework and an opaque coating layer, and a side surface of the transparent framework is provided with a non-opaque region and an opaque region, wherein the opaque coating layer is arranged on the opaque region.

14. The LED display screen according to claim 13, wherein the non-opaque region is close to the diffusion film.

15. The LED display screen according to claim 13, wherein the non-opaque region is arranged at a middle or bottom position of the matrix light-shielding frame, and the opaque coating layer is a reflective layer.

16. The LED display screen according to claim 12, wherein the matrix light-shielding frame comprises a first part and a second part that are stacked in sequence along a direction in which light exits, wherein the second part is a non-opaque structure, and the second part contacts the diffusion film.

17. A light emitting diode (LED) display screen, comprising:
   an LED array comprising a plurality of LED light emitting units and arranged on a substrate;
   a diffusion film arranged at a light-exiting side of the LED array; a portion of the substrate at a periphery of the LED array is provided with a support frame, opposite side ends of the diffusion film respectively pass through the support frame and extend to a back side of the LED array through the support frame; and
   a matrix light-shielding frame arranged between the LED array and the diffusion film and comprising a hollow grid array comprising a plurality of hollow grids, wherein the plurality of hollow grids is one-to-one corresponding to the plurality of LED light emitting units, and a projection of each of the plurality of hollow grids on the substrate surrounds a corresponding one of the plurality of LED light emitting units;
   wherein light emitted from the LED array is capable of transmitting through a projection region of the matrix light-shielding frame on the diffusion film and exiting therefrom.

18. The LED display screen according to claim 17, wherein the matrix light-shielding frame is spaced apart from the diffusion film.

19. The LED display screen according to claim 18, wherein a gap e is formed between the matrix light-shielding frame and the diffusion film, and the gap e is within a size range of 0 mm<e<2 mm.

20. The LED display screen according to claim 18, wherein a height of the support frame is larger than a height of the matrix light-shielding frame.

* * * * *